(12) United States Patent
Tendulkar et al.

(10) Patent No.: US 8,796,103 B2
(45) Date of Patent: Aug. 5, 2014

(54) FORMING NONVOLATILE MEMORY ELEMENTS BY DIFFUSING OXYGEN INTO ELECTRODES

(71) Applicants: Intermolecular Inc., San Jose, CA (US); Kabushiki Kaisha Toshiba, Tokyo (JP); SanDisk 3D LLC, Milpitas, CA (US)

(72) Inventors: Mihir Tendulkar, Mountain View, CA (US); Tim Minvielle, San Jose, CA (US); Yun Wang, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/721,476

(22) Filed: Dec. 20, 2012

(65) Prior Publication Data

US 2014/0175363 A1 Jun. 26, 2014

(51) Int. Cl.
*H01L 21/16* (2006.01)
(52) U.S. Cl.
USPC ........... 438/382; 438/104; 438/261; 438/683; 257/E45.003; 257/E29.162; 257/4
(58) Field of Classification Search
USPC ............. 257/4, E45.003, E29.162, 2; 365/46; 438/382, 104, 261, 683
See application file for complete search history.

(56) References Cited

U.S. PATENT DOCUMENTS

| | | | |
|---|---|---|---|
| 6,849,891 B1 | 2/2005 | Hsu | |
| 8,143,092 B2 * | 3/2012 | Kumar et al. | 438/104 |
| 8,354,660 B2 | 1/2013 | Sekar | |
| 2006/0068099 A1 | 3/2006 | Li | |
| 2007/0048990 A1 | 3/2007 | Zhuang et al. | |
| 2012/0032332 A1 | 2/2012 | Lim | |

* cited by examiner

*Primary Examiner* — Zandra Smith
*Assistant Examiner* — Paul Patton

(57) ABSTRACT

Provided are methods of forming nonvolatile memory elements including resistance switching layers. A method involves diffusing oxygen from a precursor layer to one or more reactive electrodes by annealing. At least one electrode in a memory element is reactive, while another may be inert. The precursor layer is converted into a resistance switching layer as a result of this diffusion. The precursor layer may initially include a stoichiometric oxide that generally does not exhibit resistance switching characteristics until oxygen vacancies are created. Metals forming such oxides may be more electronegative than metals forming a reactive electrode. The reactive electrode may have substantially no oxygen at least prior to annealing. Annealing may be performed at 250-400° C. in the presence of hydrogen. These methods simplify process control and may be used to form nonvolatile memory elements including resistance switching layers less than 20 Angstroms thick.

18 Claims, 5 Drawing Sheets

FORMING NONVOLATILE MEMORY ELEMENTS BY DIFFUSING OXYGEN INTO ELECTRODES

TECHNICAL FIELD

The present invention relates generally to semiconductor processing and more specifically to nonvolatile memory elements and methods of forming thereof.

BACKGROUND

Nonvolatile memory is computer memory capable of retaining the stored information even when unpowered. Nonvolatile memory is typically used for the task of secondary storage or long-term persistent storage and may be used in addition to volatile memory, which losses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of modifiable nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are methods of forming nonvolatile memory elements including resistance switching layers. A method involves diffusing oxygen from a precursor layer to one or more reactive electrodes by annealing. At least one of the electrodes in the memory element is reactive, while the other one may be inert. The precursor layer is converted into a resistance switching layer as a result of this diffusion. The precursor layer may initially include a stoichiometric oxide that generally does not exhibit resistance switching characteristics until oxygen vacancies are created. Metals forming such oxides may be more electronegative than metals forming the reactive electrode. The reactive electrode may have substantially no oxygen at least prior to annealing. Annealing may be performed at 250-400° C. in the presence of hydrogen. These methods simplify process control and may be used to form nonvolatile memory elements including resistance switching layers less than 20 Angstroms thick.

In some embodiments, a method of forming a nonvolatile memory element involves providing a stack containing a precursor layer and electrode and annealing the two layers such that oxygen diffuses from the precursor layer into the electrode and the precursor layer exhibits resistive switching characteristics after annealing. In other words, the precursor layer is converted into a resistance switching layer. Some examples of nonvolatile memory elements include resistive random access memory (ReRAM) cells. The nonvolatile memory elements may be integrated into memory devices and circuits.

More specifically, the provided method may involve forming a first layer including a first metal and forming a second layer including an oxide of a second metal. In some embodiments, the second metal is more electronegative than the first metal. The difference in electronegativity may be used to control oxygen diffusion between the two layers as further described above. For example, the second metal may be aluminum, while the first metal may be tantalum. In another example, the second metal may be hafnium, while the first metal may be tantalum. Other metal pairs may be used as well. Some examples of the second metal include tantalum, niobium, titanium, hafnium, strontium, and manganese alloys that form perovskite manganites when oxidized. Some examples of the first metal include aluminum, titanium, chromium, molybdenum, tungsten, and niobium.

The method may proceed with annealing the stack such that during annealing oxygen diffuses from the second layer into the first layer. The removal of oxygen from the oxide of the second metal creates oxygen vacancies in that layer. As a result, the second layer exhibits resistive switching characteristics after annealing, i.e., a resistance switching layer from the second layer. It should be noted, the resistance switching layer may need to be further activated by subjecting it to a certain voltage across the layer. This activation process is sometimes referred to as electroforming. Without being restricted to any particular theory it is believed that this activation redistributes the oxygen vacancies created in the resistance switching layer during the annealing operation. The annealing also introduces oxygen ions into the first layer and may form some oxide of the first metal, particularly at the interface with the second layer. In some embodiments, this oxide is a non-conductive oxide or an oxide that has a sufficiently high resistivity and may help to trigger the resistive switching characteristics in the second layer. For example, an oxide may have a resistivity of greater than or equal to 100 Ohm-cm in resistivity.

The oxide of the second metal may have a concentration of oxygen vacancies of less than about 0.1 atomic percent prior to this annealing operation. In specific embodiments, this oxide is a stoichiometric oxide or near stoichiometric oxide. If oxygen vacancies are present in this oxide prior to annealing, these oxygen vacancies may be evenly distributed throughout the thickness of the second layer. These vacancies may be introduced during deposition of the second layer, e.g., by controlling saturating during Atomic Layer Deposition (ALD) process or controlling oxygen concentration during Physical Vapor Deposition (PVD).

After annealing, the concentration of oxygen vacancies in the metal oxide of the second layer may be increased to a level of at least about 0.5 atomic percent or, more specifically, of at least about 1.0 atomic percent. The target concentration of oxygen vacancies in the resulting resistance switching layer may depend on the thickness of the layer, types of metal oxides, and other factors. For example, thinner layers may need fewer oxygen vacancies than thicker layers to achieve the same resistance switching characteristics. In some embodiments, the second layer has a thickness of less than about 20 Angstroms prior to annealing. Without being restricted to any particular theory, it is believed that the thickness of the second layer will not substantially change during annealing, i.e., when the second layer is converted into the resistance switching layer.

After annealing, a concentration of the oxygen vacancies in the metal oxide of the second layer may be uneven. For example, the concentration may be higher at the interface with the first layer (operable as an electrode) and decrease moving away from the interface between the two layers. The oxygen vacancies in the second layer, which may be now referred to as a resistance switching layer, may be further redistributed after additional processing, such as further downstream annealing (e.g., 750° C. for 1 minute used to activate dopants in selection devices) or activation/electroforming of the resistance switching layer.

The concentration and distribution of the oxygen vacancies in the resistance switching layer depend in part on processing conditions used during annealing. In some embodiments, the stack containing the first and second layers is maintained at a predetermined temperature of between 250° C. and 400° C. during annealing. The selected temperature controls the kinetics oxygen transport and resulting propagation of oxygen vacancies within the resistance switching layer. In some embodiments, the stack is maintained at the predetermined temperature for no more than 30 minutes. Generally, the annealing duration is restricted to avoid an excessive oxygen vacancy concentration in the resistance switching layer, particularly when the layer is relatively thin. Annealing may be performed in a hydrogen containing environment comprising no more than 10 weight percent of hydrogen.

The stack including the first and second layers may be electronically connected to other components of the memory device using one or more signal lines, e.g., a bit line and/or word line. In some embodiments, the first layer is a part of a bit line or word line of the nonvolatile memory element. In other embodiments, the first layer is a separate component conductively attached to a bit line or word line.

In some embodiments, the stack includes a third layer, which may be operable as an electrode. The third layer may be provided on an opposite side of the second layer with respect to the first layer. The third layer may directly interface the second layer or may be spaced apart from the second layer by yet another layer, e.g., an interface layer, embedded resistor layer, barrier layer, adhesion layer, and the like. The third layer may be formed before or after annealing of the stack. If the third layer is a part of the stack prior to its annealing, then during annealing the third layer may receive some oxygen ions from the second layer (be a reactive layer) or receive substantially no oxygen ions from the second layer (be an inert electrode). This ionic transfer depends on materials of the third and second layers, presence of any intermediate layers, and other factors. If the third layer is not a part of the stack prior to its annealing, then after annealing, the method may involve forming a third layer over the second layer. In this example, the third layer may be formed directly over the second layer or over one or more additional layers provided in between the second layer and the third layer. In some embodiments, the third layer is formed from titanium nitride, tantalum nitride, platinum, gold, iridium oxide, and/or ruthenium oxide.

Provided also a nonvolatile memory element that includes a first layer having a first metal and forming a first electrode of the nonvolatile memory element. The nonvolatile memory element also includes a second layer having an oxide of a second metal that is more electronegative than the first metal. The second layer may have a thickness of less than about 20 Angstroms. In some embodiments, the second metal includes hafnium, while the first metal includes tantalum.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figures 1A, 1B:
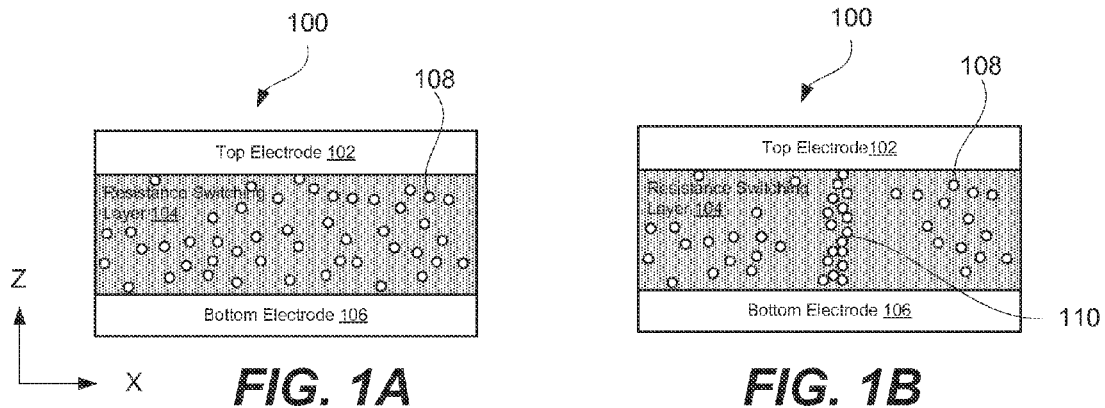
FIGS. 1A and 1B illustrate schematic representations of a ReRAM cell in its high resistive state (HRS) and low resistive state (LRS), in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

ReRAM devices generally include Metal-Insulator-Metal (MIM) stacks. This stack is basic unit of a ReRAM cell, which may include other components such as embedded resistors, diodes, and transistors. The stack includes two conductive layers operating as electrodes and forming external electrical connections to the stack. These conductive layers are identified as "M" and may include metals and other conductive materials, such as doped silicon. The stack also includes an insulator layer provided in between the electrode and identified as "I". The insulator layer exhibits resistance changing properties that are used for storing one or more bits of information in the stack. As such, the insulator layer is often referred to as a resistance switching layer. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

The provided methods of forming nonvolatile memory elements involve transferring oxygen from precursor layers (used to form or, more specifically, converted into resistance switching layers) to electrodes provided in the same stacks during annealing of the stacks. Annealing process parameters are generally much easier to control than process parameters of various deposition techniques listed above. Three main annealing parameters include annealing temperature, annealing duration, and composition of the annealing environment. In some embodiments, annealing is performed at temperatures of 250-400° C. The annealing duration may be less than 30 minutes. The annealing environment may include some hydrogen to control distribution of oxygen within the annealed structure. The hydrogen concentration in the annealing environment may be less than 10 percent by volume. Of course, these parameters depend on device types and structures, materials involved, and desired level of oxygen vacancies in resulting resistance switching layers. The provided methods may be used to repeatedly and precisely form resistance switching oxide layers that are less than 20 Angstroms thick.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen at least prior to the oxygen transfer but may form an oxide during annealing.

The stack may have a reactive electrode that receives some oxygen during annealing and inert electrode that generally does not participate in oxygen transfer. The inert electrode may be also referred to as an oxygen-resistant electrode and may be made from titanium nitride, tantalum nitride, platinum, gold, and the like. Other suitable materials for inert electrodes include various conductive oxide, such as iridium oxide and ruthenium oxide. These conductive oxides may have a resistivity of less than about 0.001 Ohm-cm. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

As stated above, at least one electrode in the stack needs to be reactive. In some embodiments, both electrodes are reactive. A reactive electrode can made from a material that reacts with oxygen to form a non-conductive oxide. In some embodiments, the bulk resistivity of the resulting oxide formed within the reactive electrode is at least about $10^{10}$ Ohm-cm. Some examples of suitable materials include aluminum, titanium, tantalum, chromium, praseodymium, molybdenum, tungsten, niobium, and the like. If a stack has only one reactive electrode, this reactive electrode may be a top electrode or bottom electrode.

When the stack has two reactive electrode, both reactive electrodes may be made from the same material or different materials. In some embodiments, each of the two reactive electrodes receives a different amount of oxygen from the precursor layer relative to the other reactive electrode. In other embodiments, one electrode is inert, while the other electrode is reactive. In these embodiments, oxygen diffusion may be easier to control and fabrication of the nonvolatile memory element may be easier to control.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. In some embodiments, a metal forming the oxide of the precursor layer is more electronegative than the metal of the reactive electrode. For example, the precursor layer may include aluminum, while the reactive electrode may include tantalum. In another example, the precursor layer includes hafnium, while the reactive layer includes tantalum. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may be present in wither one of these stacks, As stated above, annealing performed at relative mild conditions to achieve better control over oxygen diffusion between one or more reactive layers and precursor layer. For example, a temperature of between 250° C. and 400° C. and duration up to about 30 minutes may be used. The annealing environment may include argon and/or nitrogen and some hydrogen (e.g., less than about 10 percent by volume). Annealing may form a graded composition of oxygen vacancies in the precursor layer. These methods provide controllable and reproducible ways to form resistance switching layer that have thicknesses of less than about 20 Angstroms.

Examples of Re-RAM Cells and their Switching Mechanisms

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

As stated above, resistance switching layer 104, which is made of a dielectric material, can be made to conduct through one or more filaments or conduction paths formed by applying a certain voltage. To provide this resistive switching functionality, resistance switching layer 104 includes a certain concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electronic conductivity. In this example, the polarity of the pulse used to perform this change determines the direction of the change, i.e., reduction or oxidation. Other resistive switching mechanisms include bipolar electrochemical metallization mechanism and thermochemical mechanism, which leads to a change of the stoichiometry due to a current-induced increase of the temperature.

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltages (and forming one or more filaments or conduction paths) and emptying the traps by applying a reset voltage (and breaking the previously formed filaments or conduction paths).

Defects 108 can be introduced into resistance switching layer 104 during or after its fabrication. For example, a certain concentration of oxygen deficiencies can be introduced into metal oxides during their deposition or during subsequent annealing. Physical vapor deposition (PVD) and atomic layer deposition (ALD) techniques may be specifically tuned to include particular defects 108 and their distribution within resistance switching layer 104.

Operation of ReRAM cell 100 will now be briefly described with reference to

Figure 2:
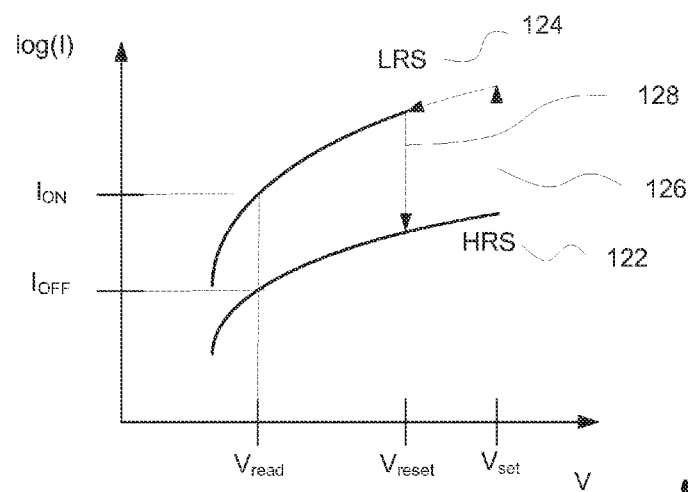
FIG. 2 illustrates a plot of a current passing through a ReRAM cell as a function of a voltage applied to the ReRAM cell, in accordance with some embodiments.

FIG. 2 illustrating a logarithmic plot of a current passing through a ReRAM cell as a function of a voltage applied to the electrode of ReRAM cell, in accordance with some embodiments. ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell that has two resistance states may be used to store one bit of data. It should be noted that some ReRAM cells may have three and even more resistance states allowing multi-bit storage in the same cell.

HRS and LRS are defined by presence or absence of one or more filaments or conduction paths in resistance switching layer 104 and forming connections between these filaments or conduction paths and two electrodes 102 and 106. For example, a ReRAM cell may be initially fabricated in LRS and then switched to HRS. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). During the read operation, the state of ReRAM cell 100 or, more specifically, the resistance of resistance switching layer 104 can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state, ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches ReRAM cell 100 from its HRS to LRS as indicated by dashed line 126. It should be noted that formation or breaking of filaments or conduction paths in resistance switching layer 104 may also involve forming or breaking electronic connections between these filaments and one (e.g., reactive electrode) or both electrodes. The overarching concern is passage of the current between the two electrodes.

In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to memory element 100 to break the previously formed filaments or conduction paths in resistance switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switches) one or more times or not performed at all. It should be noted that application of set and reset voltages to change resistance states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistance switching layer 104. In the bipolar switching the set voltage ($V_{SET}$) and reset voltage ($V_{RESET}$) applied to resistance switching layer 104 need to have different polarities.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the current during reading and writing operations may be less than about 5 µA or, more specifically, is less than about 1 µA. The length of read voltage pulse ($t_{READ}$) may be comparable to the length of the corresponding set voltage pulse ($t_{SET}$) or may be shorter than the write voltage pulse ($t_{SET}$).

A ratio of currents generated during set and reset operations may be at least about 5 or, more specifically, at least about 10 to make the state of ReRAM cell easier to determine. ReRAM cells should be able to cycle between LRS and HRS between at least about 10^3 times or, more specifically, at least about 10^7 times without failure. A data retention time ($t_{RET}$) should be at least about 5 years or, more specifically, at least about 10 years at a thermal stress up to 85° C. and small electrical stress, such as a constant application of the read voltage ($V_{READ}$).

In some embodiments, the same ReRAM cell may include two or more resistance switching layers interconnected in series. Adjacent resistance switching layers may directly interface each other or be separated by an intermediate layer.

In some embodiments, a ReRAM cell is subjected to a forming operation, during which the initially insulating properties of the resistance switching layer are altered and the ReRAM cell is configured into the initial LRS or HRS. The forming operation may include a very short high discharge current peak, which is used to set the LRS level of the resistance switching layer for subsequent switching as outlined above. In this case, a resistance switching layer with very low levels (e.g., 100-30 kOhm) of resistance in the LRS may be limited in terms of scaling down. This difficulty may be resolved by positioning such resistance switching layers in series with other components providing additional resistance to the overall ReRAM cell.

Processing Examples

Figure 3:
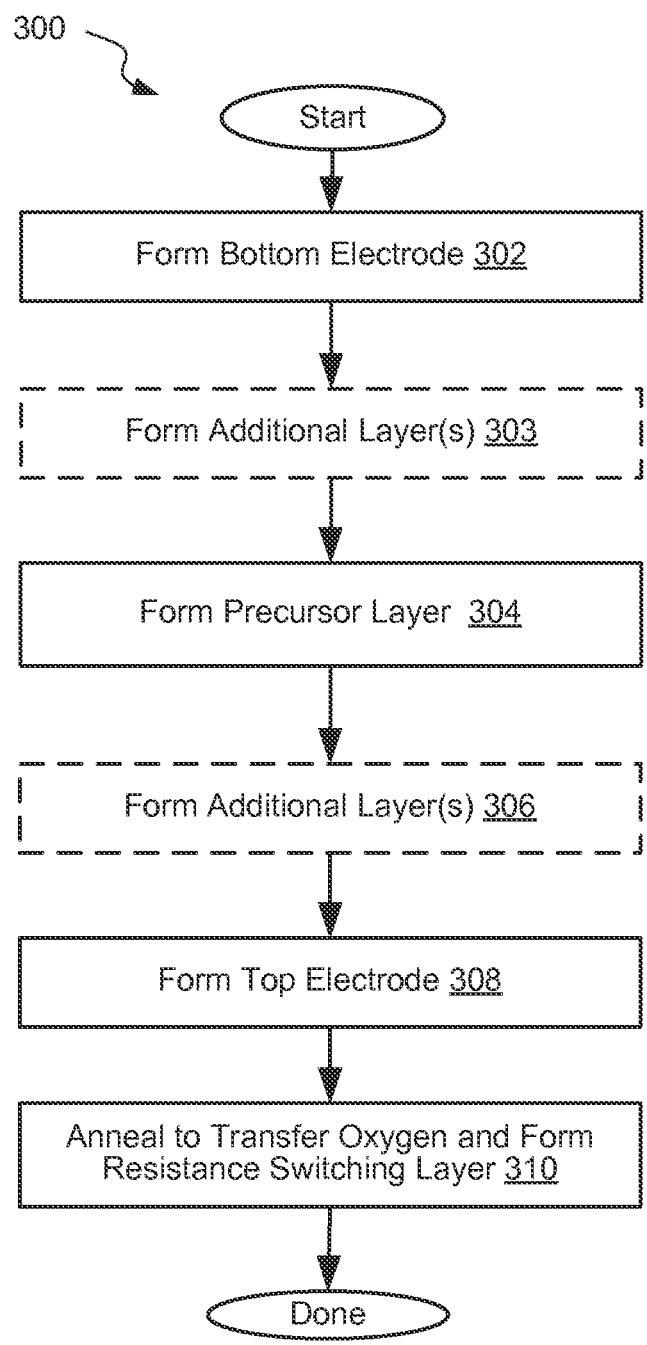
FIG. 3 illustrates a process flowchart corresponding to a method for forming a nonvolatile memory element, in accordance with some embodiments.

FIG. 3 illustrates a process flowchart corresponding to method 300 of forming a nonvolatile memory element, in accordance with some embodiments. Method 300 may commence with forming a bottom electrode during operation 302. The bottom electrode can be formed on a substrate, for example, a silicon substrate that may include one or more other layers already formed thereon. For example, the bottom electrode may be formed over a signal line, such as a bit line or a word line. In other embodiments, the bottom electrode is operable as a signal line.

The bottom electrode can be either a reactive electrode or inert electrode. As stated above, the reactive electrode will later receive oxygen from the precursor layer during annealing, while the inert electrode generally will not participate in oxygen exchange with the precursor layer. The following description provides examples of forming inert and reactive electrodes, which may be used as top electrodes or bottom electrode. As such this description is applicable to both operations 302 and 308.

The inert electrode may be made from titanium nitride, tantalum nitride, platinum, gold, and the like. For example, a titanium nitride electrode may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Other suitable materials for inert electrodes include various conductive oxide, such as iridium oxide and ruthenium oxide. In some embodiments, an inert electrode may have an oxide sub-layer facing the resistance switching layer. The rest of the electrode may be formed by the metal of this oxide and may be generally free of oxygen. For example, an initial structure may be fabricated from a metal and then pretreated to form an oxide layer resulting in a final inert electrode. If an inert electrode with a protective oxide layer is a bottom electrode, then it can be deposited as a metal layer followed by a short low-temperature anneal in oxygen prior to depositing the precursor layer, which later becomes a precursor for the resistance switching layer. On the other hand, if an inert electrode is a top electrode, then its deposition can be initiated in the oxygen environment (e.g., sputtering in an oxygen-containing plasma) to form an initial oxide sub-layer followed by deposition in an inert environment to form the remaining metal portion of the electrode.

A reactive electrode is made from a material that reacts with oxygen. Various examples of such materials are describes above and include aluminum, titanium, tantalum, chromium, praseodymium, molybdenum, tungsten, niobium, and the like. For example, a titanium electrode may be formed using PVD or other suitable deposition techniques. Deposition of the titanium electrode may be performed using a titanium target in an insert atmosphere maintained at a pressure of between about 1-20 mTorr. The power may be maintained at 150-500 Watts with resulting in a deposition rate of about 0.5-5 Angstroms per second. Again, these process parameters are provided as examples. It should be noted that only one electrode (i.e., the bottom electrode) is formed prior to operation 304. The other electrode (i.e., the top electrode) is formed after forming a precursor layer in operation 304. Annealing operation 310 can be performed at any time after forming the precursor layer in operation 304.

Method 300 may proceed with forming a precursor layer during operation 304. The precursor layer may be formed directly over the bottom electrode and interface with the bottom electrode. Alternatively, or one or more additional layers may be provided in between the precursor layer and bottom electrode as reflected by optional operation 303. Additional layer may be used to control diffusion of oxygen between the bottom electrode and precursor layer. For example, if the bottom electrode is a reactive electrode, a barrier layer that has good diffusion barrier characteristics (e.g., poor oxygen migration) may be deposited in between to protect the reactive electrode. Furthermore, other functional layers, such as an embedded resistor, current steering element, and the like may be position in between the bottom electrode and precursor layer. In these examples, the bottom electrode may be inert. If a bottom electrode is reactive and is used to receive oxygen from the precursor layer during annealing, then any additional layer provided in between the bottom electrode and precursor layer are sufficiently permeable to oxygen to allow this transfer.

In the same manner, one or more additional layers may be provided in between the precursor layer and top electrode as reflected by optional operation 306. As stated above, additional layers may be used to control diffusion of oxygen, in this case, between the top electrode and precursor layer. Furthermore, other functional layers such as embedded resistor, current steering element, and the like may be position in between the top electrode and precursor layer. In these examples, the top electrode may be inert. If a top electrode is reactive and is used to receive oxygen from the precursor layer during annealing, then any additional layer provided in between the top electrode and precursor layer are sufficiently permeable to oxygen to allow this transfer.

Returning to operation 304, the formed precursor layer may include an oxide of a metal that is more electronegative than the metal of a reactive electrode. Various examples of suitable materials are listed above. For example, a stoichiometric hafnium oxide layer may be deposited using PVD or other suitable techniques. This layer may have a thickness of less than about 20 Angstroms and may be formed using reactive sputtering by employing a metal hafnium target in a 20-60% oxygen atmosphere for stoichiometric oxide and 5-20% for sub-stoichiometric oxides. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistance switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$), and a suitable oxidant, such as water, oxygen plasma, or ozone.

At some point, method 300 may proceed with forming a top electrode as reflected by operation 308. As stated above, the top electrode may be inert or reactive. Deposition of both types of electrodes is presented above with reference to operation 302 and is applicable to deposition of the top electrode during operation 308.

Method 300 also involves annealing operation 310. Annealing may be performed at any time after forming the precursor layer. For example, annealing may be performed after both top and bottom electrodes are formed (and include the precursor layer in between the two electrodes). In this example, one or both electrodes may be reactive. One of the two electrodes may be inert. Alternatively, annealing may be performed before forming the top electrode, e.g., after forming a precursor layer over the bottom electrode, which has to be a reactive electrode. In this example, the top electrode is formed after annealing is performed.

Regardless of the order, annealing effects oxygen diffusion from the precursor layer into one or more reactive electrodes. As a result of this diffusion, the precursor layer is converted into a resistance switching layer that exhibits resistance switching characteristics. The annealing may be performed at a temperature of between about 150° C. and 500° C. or, more specifically, at between about 250° C. and 400° C., or even at about between 300° C. and 350° C. Duration of the annealing may be less than 60 minutes or, more specifically, less than 30 minutes or, even more specifically, less than 15 minutes. One having ordinary skills in the art would appreciate that these temperature and duration ranges generally depend on materials of precursor and reactive layers. The upper limit may be defined by conventional thermal budget of back-end of line (BEOL) CMOS. In some embodiments, a diode may be used in the circuit that requires activation anneal of 750° C. for about 1 minute. Lowering the upper limit temperature permits a longer anneal and enables the annealing ambient to penetrated into the material stack. Hydrogen typically helps with capturing oxygen from an oxide but it requires longer periods for diffusion to occur.

Figure 4A:
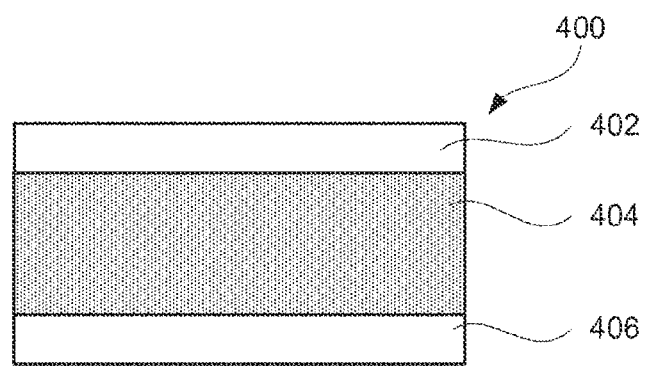
FIGS. 4A-4B illustrate a portion of the nonvolatile memory element at various processing stages, in accordance with some embodiments.
Figure 4B:
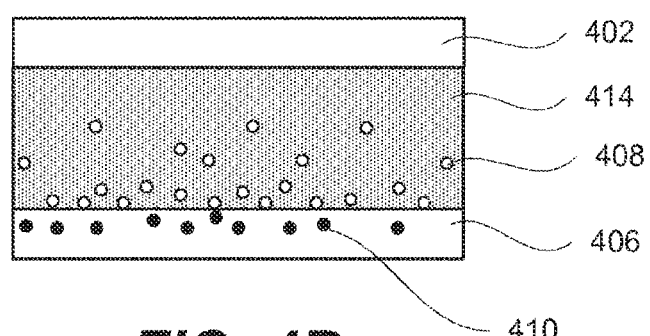

Annealing or, more specifically, oxygen diffusion from the precursor layer creates oxygen deficiencies in the precursor layer. FIGS. 4A-4B illustrate a portion of the nonvolatile memory element at various processing stages, in accordance with some embodiments. Specifically, FIG. 4A illustrates a stack 400 including an inert layer 402, precursor layer 404, and reactive layer 406 prior to annealing. Precursor layer 404 may be made from a stoichiometric oxide and include substantially no oxygen vacancies prior to annealing. In some embodiments, reactive layer 406 may include substantially no oxygen prior to annealing. During annealing, oxygen diffuses from precursor layer 404 and into reactive layer 406 forming oxygen vacancies 408 in resistance switching layer 414 (formed from precursor layer 404) and oxide portions 410 in reactive electrode 406. A schematic illustration of the stack after annealing is illustrated in FIG. 4B.

Distribution of oxygen vacancies 408 in the resulting resistance switching layer 414 and oxide portions 410 in reactive electrode 406 may be uneven throughout thicknesses of these components. In some embodiments, oxygen vacancies 408 and oxide portions 410 are concentrated at the interface between resistance switching layer 414 and reactive electrode 406. Distribution of oxygen vacancies 408 and oxide portions 410 typically depends on annealing conditions and may change during subsequent operations. For example, oxygen vacancies 408 may be redistributed during electroforming of the nonvolatile memory element by subjecting resistance switching layer 414 to a certain voltages. Furthermore, oxygen vacancies 408 may be redistributed within resistance switching layer 414 during setting and resetting of the nonvolatile memory element.

Figure 5:
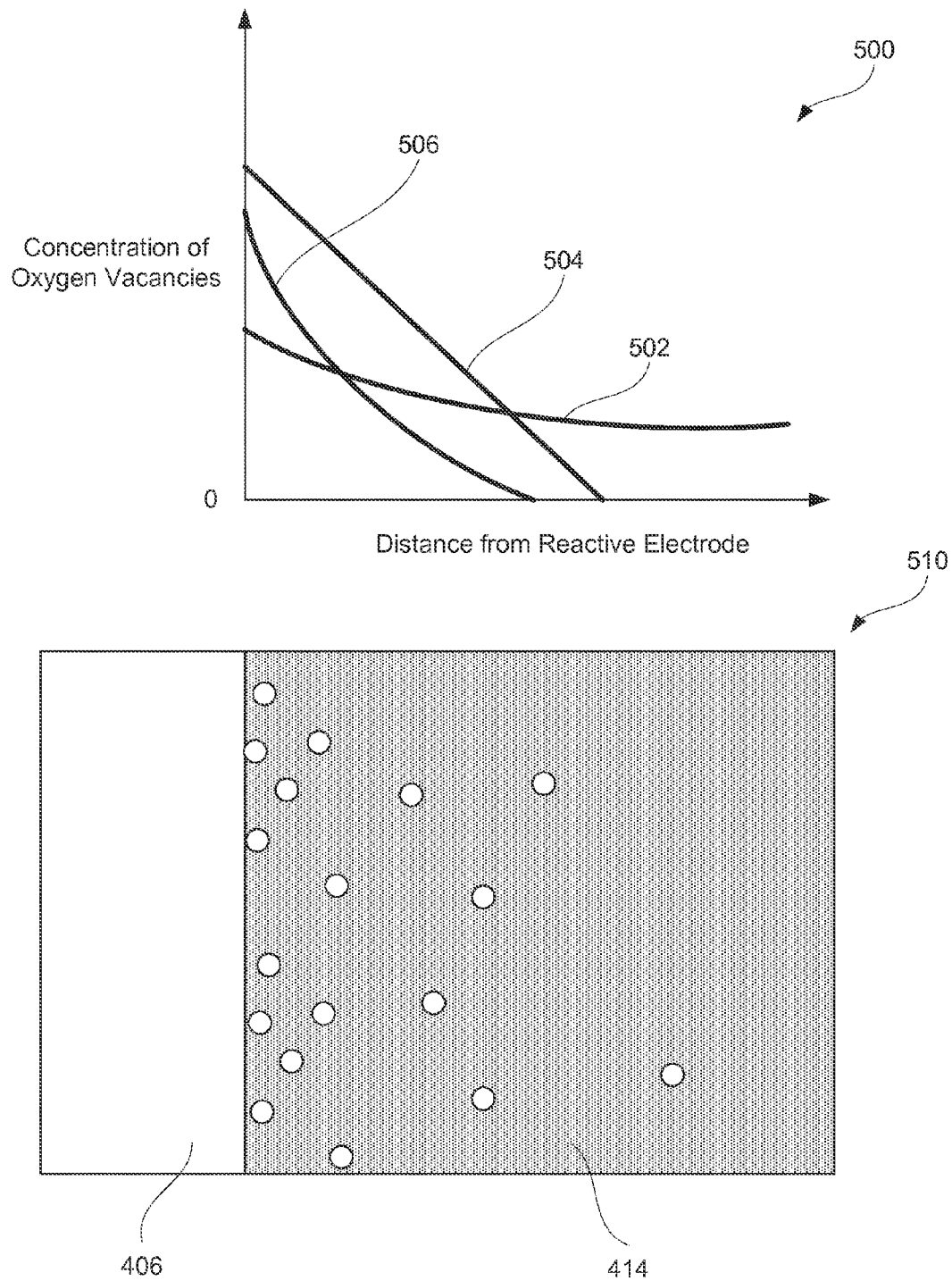
FIG. 5 illustrates a schematic cross-section of a portion of the nonvolatile memory element and corresponding plot reflecting oxygen vacancy distribution in this portion, in accordance with some embodiments.

FIG. 5 illustrates a schematic cross-section of a portion of the nonvolatile memory element 510 and corresponding plot 500 reflecting different oxygen vacancy distributions in this portion after annealing, in accordance with some embodiments. Specifically, concentrations of oxygen vacancies are presented as a function of the distance from the reactive electrode. The distance axis of plot 500 is schematically aligned with relevant component of nonvolatile memory element 510 such that the zero corresponds to an interface between reactive electrode 406 and resistance switching layer 414. Line 502 represents the most gradual distribution of oxygen vacancies in resistance switching layer 414, while line 506 represents the steepest decrease in the concentration moving away from the interface. Line 506 also indicates that oxygen vacancies only exists in some interface region of resistance switching layer 414 (defined by an intersection of line 506 with the horizontal axis), while the rest of resistance switching layer 414 may be free from oxygen vacancies (at least after annealing and prior to electroforming). Both lines 502 and 506 represent non-linear distribution of vacancies, while line 504 represents a linear trend.

Memory Array Examples

Figure 6A:
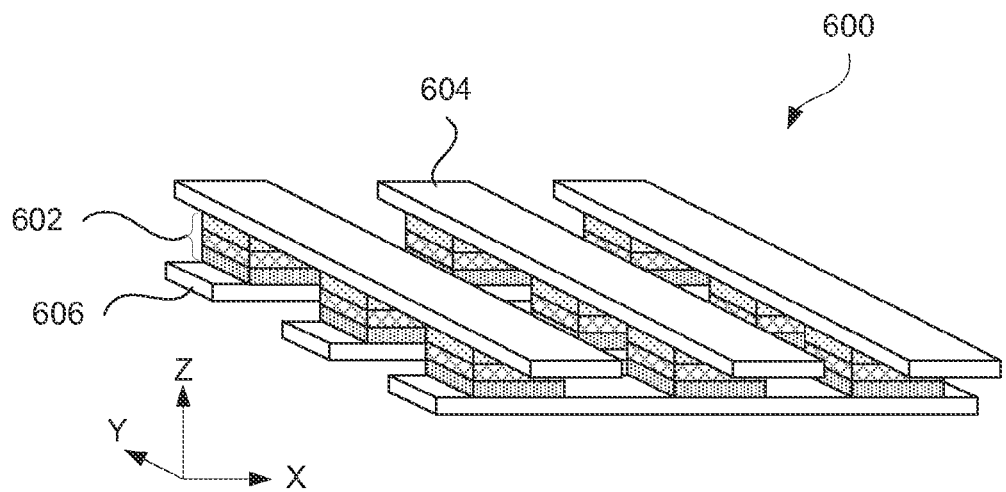
FIGS. 6A and 6B illustrate schematic view of memory arrays including multiple nonvolatile memory elements, in accordance with some embodiments.

ReRAM cells described above may be used in memory devices or larger ICs that may take a form of arrays including multiple ReRAM cells. FIG. 6A illustrates a memory array 600 including nine ReRAM cells 602, in accordance with some embodiments. In general, any number of ReRAM cells may be arranged into one array. Connections to each ReRAM cells 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cells 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which further described elsewhere in this document. In some embodiments, a ReRAM cell includes multiple resistance switching layers provided in between a crossing pair of signal lines 604 and 606.

As stated above, various read and write controllers may be used to store and retrieve digital data in ReRAM cells 602. A suitable controller is connected to ReRAM cells 602 by signal lines 604 and 606 and may be a part of the same memory device and circuitry. In other embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each cell. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
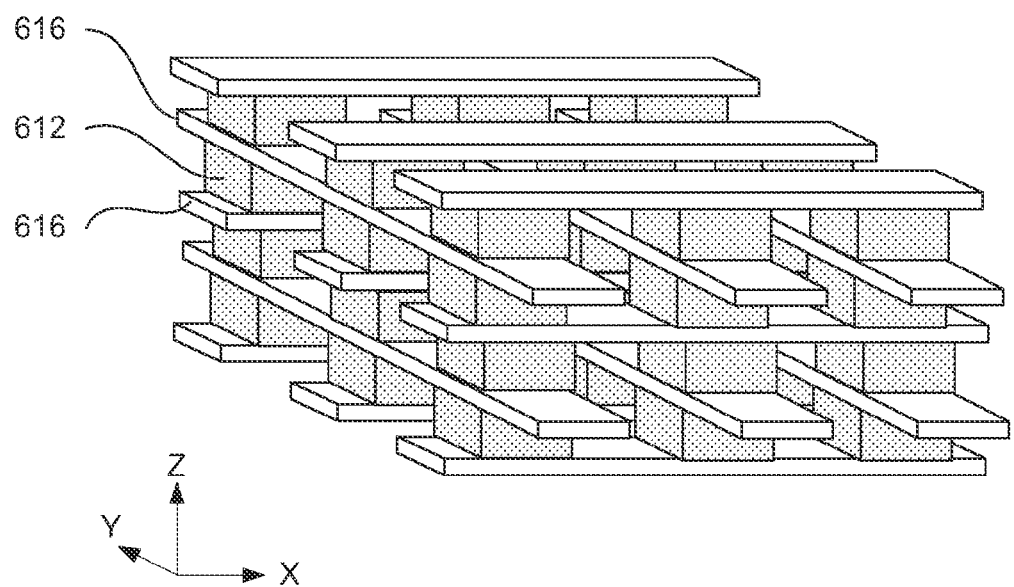

In some embodiments, a memory device may include multiple arrays layers as, for example, illustrated in FIG. 6B. In this example, five sets of signal lines 614 and 616 are shared by four s ReRAM arrays 412. As with the previous example, each ReRAM array 412 is supported by two sets of signal lines 614 and 616. However, each middle set of signal lines is shared by two sets ReRAM arrays. The top and bottom sets of signal lines are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of forming a nonvolatile memory element, the method comprising:
   forming a first layer, the first layer comprising a first metal, wherein the first layer is operable as a first electrode;
   forming a second layer, the second layer comprising an oxide of a second metal that is more electronegative than the first metal; and
   annealing the first layer and the second layer,
   wherein oxygen diffuses from the second layer into the first layer;
   wherein the second layer exhibits resistance switching characteristics after annealing; and
   wherein the annealing is performed in a hydrogen containing environment comprising no more than 10 weight percent of hydrogen.

2. The method of claim 1, wherein the second metal comprises aluminum and the first metal comprises tantalum.

3. The method of claim 1, wherein the second metal comprises hafnium and the first metal comprises tantalum.

4. The method of claim 1, wherein the second layer is formed after forming the first layer.

5. The method of claim 1, wherein the second layer directly interfaces the first layer.

6. The method of claim 1, wherein the first metal comprises one or more of aluminum, titanium, chromium, molybdenum, tungsten, or niobium.

7. The method of claim 1, wherein, prior to annealing, the oxide of the second metal has a concentration of oxygen vacancies of less than 0.1 atomic percent.

8. The method of claim 1, wherein, after annealing, the oxide of the second metal has a concentration of oxygen vacancies of at least 0.5 atomic percent.

9. The method of claim 1, wherein annealing is performed at a temperature of between 250° C. and 400° C.

10. The method of claim 9, wherein a duration of the annealing is less than 30 minutes.

11. The method of claim 1, wherein the second layer has a thickness of less than about 20 Angstroms.

12. The method of claim 1, wherein the first layer is a part of a bit line or a word line in the nonvolatile memory element.

13. The method of claim 1, further comprising forming a third layer on an opposite side of the second layer with respect to the first layer, wherein the third layer is operable as a second electrode of the nonvolatile memory element.

14. The method of claim 13, wherein, during annealing, substantially no oxygen diffuses from the second layer into the first layer.

15. The method of claim 14, wherein the third layer comprises one or more of titanium nitride, tantalum nitride, platinum, gold, iridium oxide, or ruthenium oxide.

16. The method of claim 13, wherein the third layer comprises the first metal and wherein, during annealing, oxygen diffuses from the second layer into the third layer.

17. A method of forming a nonvolatile memory element, the method comprising:
   forming a first layer, the first layer comprising a first metal, wherein the first layer is operable as a first electrode;
   forming a second layer, the second layer comprising an oxide of a second metal that is more electronegative than the first metal; and
   forming a third layer, the third layer comprising an oxygen resistant material, wherein the third layer is operable as a second electrode, and wherein the second layer is positioned between the first layer and the third layer;
   annealing the first layer, the second layer, and the third layer at a temperature of between 250° C. and 400° C.;
   wherein oxygen diffuses from the second layer into the first layer but substantially no oxygen diffuses from the second layer into the third layer;
   wherein the second layer exhibits resistance switching characteristics after annealing; and
   wherein, after the annealing, a concentration of oxygen vacancies in the second layer is uneven.

18. A nonvolatile memory element comprising:
   a first layer comprising a first metal and an oxide of the first metal, wherein the first layer is operable as a first electrode;
   a second layer comprising an oxide of a second metal that is more electronegative than the first metal, wherein the oxide of the second metal comprises oxygen vacancies at least at an interface between the second layer and the first layer such that the second layer is operable as a resistance switching layer; and
   a third layer comprising an oxygen resistant material, wherein the third layer is operable as a second electrode, and wherein the second layer is positioned between the first layer and the third layer.

* * * * *